(12) United States Patent
Pullela et al.

(10) Patent No.: US 8,798,216 B2
(45) Date of Patent: Aug. 5, 2014

(54) HIGH DYNAMIC RANGE RADIO ARCHITECTURE WITH ENHANCED IMAGE REJECTION

(75) Inventors: Raja Pullela, Irvine, CA (US); Yu Su, Irvine, CA (US); Wenjian Chen, Irvine, CA (US)

(73) Assignee: MaxLinear, Inc., Carlsbad, CA (US)

( * ) Notice: Subject to any disclaimer, the term of this patent is extended or adjusted under 35 U.S.C. 154(b) by 730 days.

(21) Appl. No.: 12/984,921

(22) Filed: Jan. 5, 2011

(65) Prior Publication Data

US 2011/0222633 A1    Sep. 15, 2011

Related U.S. Application Data

(60) Provisional application No. 61/292,417, filed on Jan. 5, 2010.

(51) Int. Cl.
*H04B 1/10* (2006.01)

(52) U.S. Cl.
USPC ........... 375/349; 375/318; 375/346; 375/350; 455/285; 455/296; 455/302

(58) Field of Classification Search
USPC ......... 455/130, 269, 280, 283, 285, 296, 302; 375/229–235, 316–319, 323–329, 375/340–351, 354–355, 362, 371, 373
See application file for complete search history.

(56) References Cited

U.S. PATENT DOCUMENTS 6,348,830 B1    2/2002    Rebeiz et al.

(Continued)

FOREIGN PATENT DOCUMENTS

| EP | 0821473 B1 | 10/2001 |
|---|---|---|
| EP | 1577879 B1 | 7/2008 |
| WO | WO 2006/102185 A2 | 9/2006 |

OTHER PUBLICATIONS

International Preliminary Report on Patentability with Written Opinion for PCT Application No. PCT/US2011/020257, mailed Jul. 19, 2012; 11 pages.

(Continued)

*Primary Examiner* — Sam K Ahn
*Assistant Examiner* — James M Perez
(74) *Attorney, Agent, or Firm* — Ardeshir Tabibi, Esq.; Kilpatrick Townsend & Stockton LLP

(57) ABSTRACT

A circuit for down-converting an RF signal to a baseband signal includes a trans-admittance amplifier adapted to receive the RF signal and generate in response a pair of differential current signals. The circuit further includes a trans-impedance amplifier having at least four mixers and at least four linear amplifiers. The four mixers frequency down-convert the pair of differential current signals to generate four pairs of differential baseband current signals, wherein each pair of the differential baseband current signals has a different phase and is associated with each of the linear amplifiers. Additionally, the circuit includes a summing block that generates an in-phase signal using a first weighted sum of the four different baseband current signals and a quadrature signal using a second weighted sum of the four different baseband current signals. The circuit further includes an analog-to-digital converter for converting the in-phase and quadrature signals to respective digital representations.

11 Claims, 2 Drawing Sheets

(56) References Cited

U.S. PATENT DOCUMENTS

| | | | |
|---|---|---|---|
| 7,324,561 B1* | 1/2008 | Miller et al. | 370/516 |
| 7,519,348 B2 | 4/2009 | Shah | |
| 7,773,688 B2* | 8/2010 | Sorrells et al. | 375/295 |
| 2006/0126702 A1* | 6/2006 | Burdett | 375/136 |
| 2006/0293017 A1* | 12/2006 | Kim et al. | 455/323 |
| 2008/0130802 A1 | 6/2008 | Conroy et al. | |
| 2008/0284487 A1 | 11/2008 | Pullela et al. | |
| 2009/0143031 A1* | 6/2009 | Shah | 455/114.1 |
| 2009/0325510 A1* | 12/2009 | Pullela et al. | 455/76 |
| 2010/0330947 A1* | 12/2010 | Khoury et al. | 455/302 |
| 2012/0063555 A1* | 3/2012 | Pullela et al. | 375/350 |

OTHER PUBLICATIONS

International Search Report and Written Opinion corresponding to the PCT Application No. PCT/US2011/020257, date of mailing Mar. 25, 2011, 20 pages.

* cited by examiner

HIGH DYNAMIC RANGE RADIO ARCHITECTURE WITH ENHANCED IMAGE REJECTION

CROSS-REFERENCES TO RELATED APPLICATIONS

The present application claims benefit under 35 USC 119(e) of U.S. provisional application No. 61/292,417, filed Jan. 5, 2010, entitled "Cerberus Radio," the content of which is incorporated herein by reference in its entirety.

BACKGROUND OF THE INVENTION

The present invention relates to communication systems, and more particularly to a high-linearity low-noise radio.

Generally, a radio uses one or more mixers to down-convert a radio frequency (RF) signal to a baseband signal. A problem with a conventional mixer used in a down-converter is that it generates unwanted harmonics, such as third and fifth harmonics. These harmonics may disturb the radio sensitivity, cause distortion in the RF signal, and/or cause electromagnetic interference. Accordingly, there is a need for improved circuits and methods to eliminate or at least reduce these harmonics.

BRIEF SUMMARY OF THE INVENTION

Embodiments of the present invention provide circuits and methods for eliminating or reducing harmonics in a radio. An embodiment of the present invention provides a circuit for down-converting an RF signal to a baseband signal. The circuit includes a trans-admittance amplifier adapted to receive the RF signal and generate in response a pair of differential current signals. The circuit further includes a trans-impedance amplifier that comprises at least four mixers and at least four linear amplifiers. The at least four mixers frequency down-convert the pair of differential current signals to generate four pairs of differential baseband current signals, wherein each pair of the differential baseband current signals has a different phase and is associated with each of the linear amplifiers. Additionally, the circuit includes a summing block that generates an in-phase signal using a first weighted sum of the four different baseband current signals and a quadrature signal using a second weighted sum of the four different baseband current signals.

In an alternative embodiment, a circuit for reducing harmonics in a received signal includes a trans-admittance amplifier adapted to receive an RF signal and generate in response a pair of differential current signals. The circuit further includes a trans-impedance amplifier that comprises at least four mixers and at least four linear amplifiers. The at least four mixers frequency down-convert the pair of differential current signals to generate four pairs of differential baseband current signals, wherein each pair of the differential baseband current signals has a different phase and is associated with one of the linear amplifiers. Additionally, the circuit includes a summing block that generates an in-phase harmonic signal using a first weighted sum of at least a first three of the four different baseband current signals and a quadrature harmonic signal using a second weighted sum of at least a second three of the four different baseband current signals. The circuit additionally includes an analog-to-digital converter module that converts the in-phase and quadrature harmonic signals to respective digital representation. The circuit also includes a digital processing unit adapted to eliminate or at least reduce the harmonics of one of the differential baseband current signals based on the in-phase and quadrature harmonic signals using a least mean squares algorithm.

In another embodiment of the present invention, a method for providing a baseband signal having reduced harmonics includes receiving an RF signal and generating in response a pair of differential current signals. The method further includes frequency down-converting the pair of differential current signals and generating four pairs of differential baseband current signals. The method also includes generating an in-phase signal using a first weighted sum of the four pairs of differential baseband current signals and generating a quadrature signal using a second weighted sum of the four pairs of differential baseband current signals.

In yet another embodiment of the present invention, a method for providing a baseband signal having reduced harmonics includes receiving an RF signal and generating in response a pair of differential current signals. The method further includes frequency down-converting the pair of differential current signals and generating four pairs of differential baseband current signals. The method also includes generating an in-phase harmonic signal using a first weighted sum of at least a first three of the four pairs of differential baseband current signals and generating a quadrature harmonic signal using a second weighted sum of at least a second three of the four pairs of differential baseband current signals. The method additionally includes canceling harmonics in the baseband based on the in-phase and quadrature harmonic signals. In a specific embodiment, the canceling includes the use of a least mean squares algorithm.

BRIEF DESCRIPTION OF THE DRAWINGS

The accompanying drawings, which are incorporated herein and form a part of the specification, illustrate the present invention and, together with the description, further serve to explain embodiments of the invention.

DETAILED DESCRIPTION OF THE INVENTION

Figure 1:
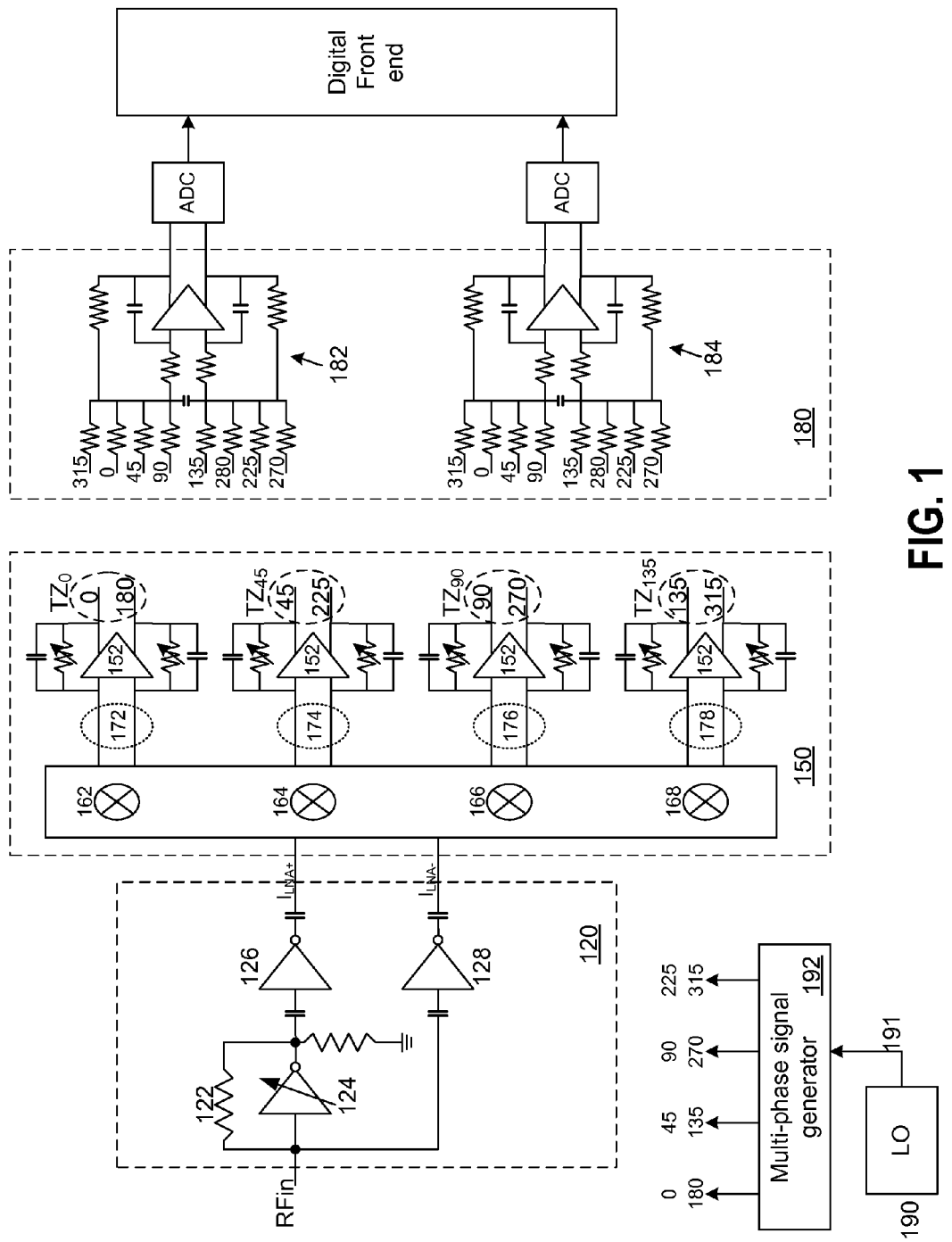
FIG. 1 is a block diagram illustrating a high linearity low noise radio circuit according to an embodiment of the present invention.

FIG. 1 is a block diagram of a radio 100 according to one exemplary embodiment of the present invention. Radio 100 is shown as including, in part, a wide-band low-noise trans-admittance amplifier 120 that generates differential output currents $I_{LNA+}$ and $I_{LNA-}$. In an embodiment, the low-noise trans-impedance amplifier includes a low-noise amplifier 124 having a feedback resistor 122 disposed across its input and output terminals. The feedback resistor is used to provide the required input termination resistance. The low-noise trans-admittance amplifier further includes a gain stage 126 capacitively coupled to the output terminal of the amplifier 124. The low-noise trans-admittance amplifier also includes a gain stage 128 that is capacitively coupled to the input terminal of the amplifier 124. In an embodiment, the noise introduced by amplifier 124 has the same polarity at the outputs of gain stages 126 and 128. This noise is then canceled at the outputs of gain stages 126 and 128 due to the common mode rejection of a following stage.

Radio 100 also includes a trans-impedance amplifier 150 coupled to the trans-admittance amplifier. In an embodiment, the trans-impedance amplifier includes at least four mixers 162, 164, 166, 168 that are configured to receive the differential current signals $I_{LNA+}$, $I_{LNA-}$ from the low-noise trans-admittance amplifier 120 and frequency down-convert them to at least four respective differential output signals 172, 174, 176, 178. Each of the four output signals are coupled to one of the four respective amplifiers 152, 154, 156, 158. In an embodiment, each of the amplifiers is a wide bandwidth amplifier having a differential output and a programmable gain that is digitally controlled. In an embodiment, the bandwidth of the amplifiers may be 4 MHz and higher.

In an embodiment of the present invention, the differential current signals supplied by low noise trans-admittance amplifier 120 remain in the current domain as their frequency is down-converted by mixers 162, 164, 166 and 168 and as they are amplified by amplifiers 152, 154, 156, and 158, to generate signals $TZ_0$, $TZ_{45}$, $TZ_{90}$, $TZ_{135}$, thereby improving the linearity of the low noise trans-admittance amplifier and the mixers. In the embodiment, each of the $TZ_0$, $TZ_{45}$, $TZ_{90}$, $TZ_{135}$ signals is shown as being a differential signal having a differentially positive and a differentially negative signal component. Radio 100 further includes a summation block 180 that is coupled to the amplifiers 152, 154, 156, and 158. In an embodiment, the summation block includes a first summing amplifier 182 and a second summing amplifier 184. Each of the summing amplifiers receives the $TZ_0$, $TZ_{45}$, $TZ_{90}$, $TZ_{135}$ signals and generates a weighted sum of the signals $TZ_0$, $TZ_{45}$, $TZ_{90}$, $TZ_{135}$ to generate an in-phase (I) signal and a quadrature (Q) signal.

Radio 100 further includes an oscillator circuit 190 that provides a reference signal 191 to a multi-phase signal generator 192. In an embodiment, the local oscillator may be a frequency synthesizer and the multi-phase signal generator may include multiple divider by 2 circuits and produces digital signals having the same frequency but different phases for the four mixers 162, 164, 166, 168. In another embodiment, the multi-phase clock generator may be poly-phase filters that may include resistive and capacitive components to produce sinusoidal signals having the same frequency but different phases for the mixers. In yet another embodiment, the multi-phase signal generator 192 may be integrated within the oscillator circuit.

In an embodiment, each mixer uses a 12.5% duty cycle non-overlapping clock to provide four differential baseband outputs. These differential outputs may be described as samples of the RF waveform at four different oscillation phases—0, 45, 90 and 135 degrees. In a conventional down-converter only quadrature outputs at phases of 0° and 90°, called I and Q signals respectively, are available. In accordance with the present invention, however, a weighted sum of four phases are used to generate the I and Q signals.

In accordance with one embodiment of the present invention, the I and Q signals are generated using the weighted sum as shown in Equations (1) and (2) below, each with harmonic rejection of the $3^{rd}$ and $5^{th}$ harmonics at the RF input.

$$I = TZ_0 + (\sqrt{2}+1)TZ_{45} + (\sqrt{2}+1)TZ_{90} + TZ_{135} \quad (1)$$

$$Q = (\sqrt{2}+1)TZ_0 + TZ_{45} + TZ_{90} + (\sqrt{2}+1)TZ_{135} \quad (2)$$

Numerically, the in-phase signal I comprises $1 \times TZ_0$, 2.41 ($\sqrt{2}+1$)$\times TZ_{45}$, $2.41 \times TZ_{90}$, and $1 \times TZ_{135}$. Similarly, the quadrature signal Q comprises $2.41 \times TZ_0$, $1 \times TZ_{45}$, $1 \times TZ_{90}$, and $2.41 \times TZ_{135}$.

In an embodiment, the summation block 180 is shown as having a bi-quad gain stage that generates the final I and Q signals. The presence of the op-amp with virtual ground node provides a convenient summing node. Scaling of the baseband outputs is achieved by selecting the appropriate resistors in the trans-impedance amplifier 150. In an embodiment, the composite frequency response of the real pole in the trans-impedance amplifier 150 and the pair of complex poles is a third order Butterworth filter. As is seen from the above description, the signals remain in the current domain even while being frequency down-converted all the way down to the baseband region of operation.

Additionally, radio 100 includes a digital-to-analog converter stage that converts the I and Q signals to a digital representation to provide to a digital front end (DFE) for further processing.

Additional Harmonic Rejection Using LMS

The four signals at the output of trans-impedance amplifier 150 carry an estimate of the desired signals and the unwanted signals at harmonics of the RF frequency. As described above, a weighted sum of these signals is used in accordance with the present invention to provide estimates of the desired I and Q signals.

In an alternative embodiment of the present invention, another weighted sum of the output signals of trans-impedance amplifier 150 is used to provide estimates of the signal at the $3^{rd}$ or $5^{th}$ harmonic. In one exemplary embodiment, the $3^{rd}$ or $5^{th}$ harmonics are obtained using the following expression:

$$I_{harm} = TZ_{315} - \sqrt{2}TZ_0 + TZ_{45} \quad (3)$$

$$Q_{harm} = TZ_{45} - \sqrt{2}TZ_{90}TZ_{135} \quad (4)$$

These signals can be digitized in a relatively simple Analog-to-digital converter (ADC) to generate a digital representation of the complex signal at the harmonic frequency. Using this complex signal as a reference, a least mean square (LMS) algorithm may then be used to detect and cancel the signal leaking into the main path. In one example embodiment, at least a 20 dB improvement in $3^{rd}$ and $5^{th}$ harmonic rejection is achieved.

Figure 2:
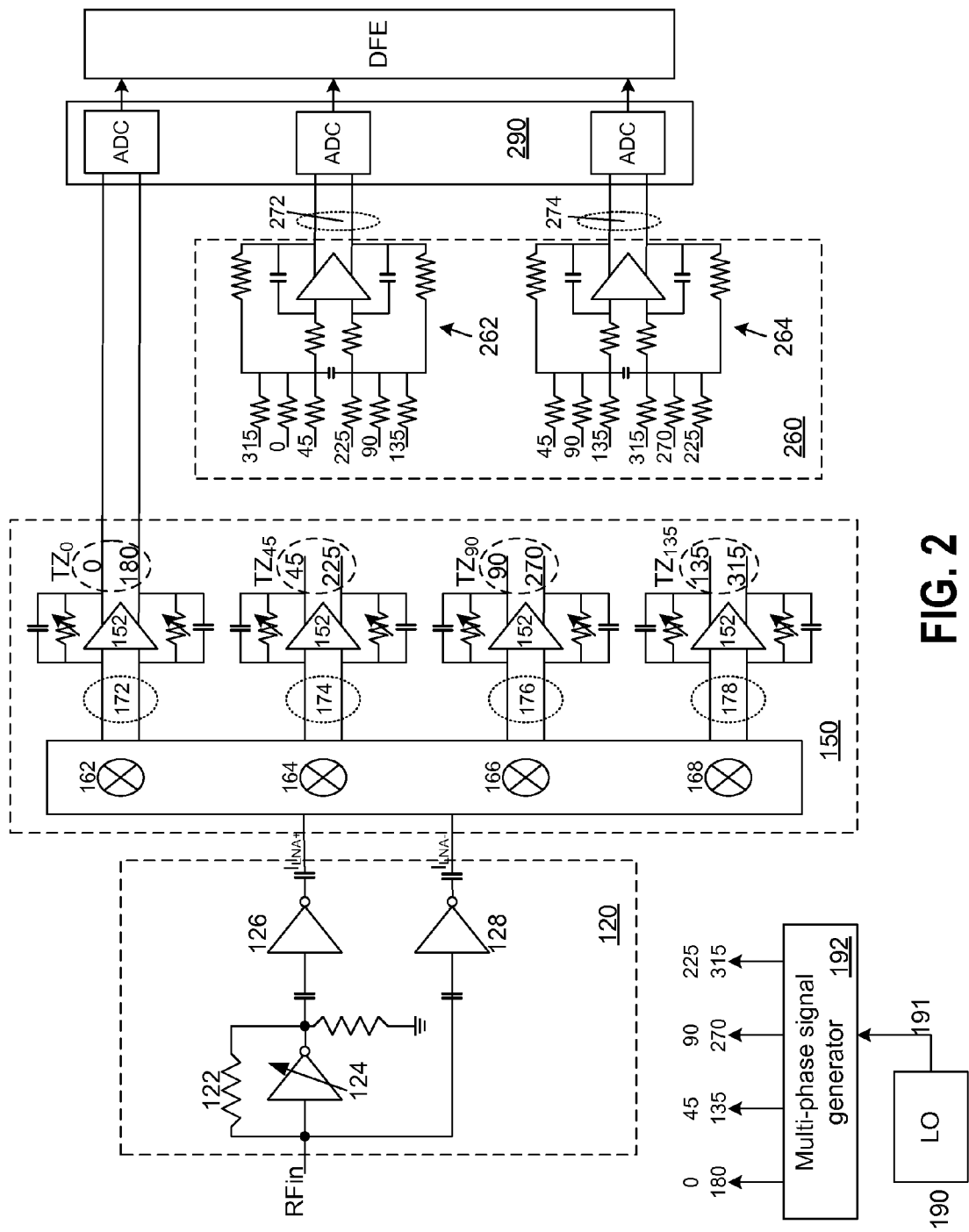
FIG. 2 is a simplified block diagram illustrating a high linearity low noise circuit according to an alternative embodiment of the present invention.

FIG. 2 is a schematic diagram of a radio 200 according to an alternative embodiment of the present invention. Radio 200 includes a wideband low-noise trans-admittance amplifier 120 configured to receive an RF signal and produce a pair of differential current signals $I_{LNA+}$ and $I_{LNA-}$. Radio 200 also includes a trans-impedance amplifier 150 coupled to the trans-admittance amplifier. In an embodiment, the trans-impedance amplifier includes at least four mixers 162, 164, 166, 168 that are configured to receive the differential currents from the low-noise trans-admittance amplifier 120 and frequency down-convert them to at least four respective differential output signals 172, 174, 176, 178. Each of the four output signals are coupled to one of the four respective amplifiers 152, 154, 156, 158. Each of the four amplifiers provides a respective pair of differential signals $TZ_0$, $TZ_{45}$, $TZ_{90}$, $TZ_{135}$. The trans-admittance amplifier and the trans-impedance amplifiers have been described in sections above and will not be further explained for sake of brevity.

Radio 200 further includes a local oscillator 190 configured to produce a reference frequency signal 191 to a multi-phase generator 192 that generates multiple clock signals having the same frequency but with different phases. In an embodiment of the present invention, multi-phase generator 192 will be implemented using divide-by-2 circuits known to one of skill in the art to produce the four differential output signals at four different phases (0, 180), (45, 225), (90, 270), and (135, 315).

Radio 200 includes a summing block 260 that generate an in-phase harmonic signal 272 and a quadrature harmonic signal 274. In an embodiment, summing block 260 includes a summing amplifier 262 that generates the in-phase harmonic signal in accordance with Equation (3) and a summing amplifier 264 that generates the quadrature harmonic signal 274 in accordance with Equation (4) and using the output signals of trans-impedance amplifier 150.

Radio 200 also includes an analog-to-digital converter block 290 that converts the in-phase and quadrature harmonic signals and at least one of the four pairs of differential baseband current signals to their respective digital representations. In a specific embodiment, the at least one of the four pairs of differential baseband current signals may be the one that has the differential phases (0, 180) as shown in FIG. 2. The at least one of the four pairs of different baseband current signals may contain harmonics that can be eliminated based on the in-phase and quadrature harmonic signals in a subsequent digital front end (DFE) module. In a specific embodiment, the elimination of the harmonics in the baseband current signals may use a least mean squares algorithm to detect and cancel the harmonics as described in sections above.

Many alternatives, modifications, and variations will be apparent to those skilled in the art in light of the above teachings. For example, the detection and cancellation of the harmonics may use other algorithms than the disclosed LMS algorithm. The weighted sum may also use other hardware summing circuits other than the shown summing amplifiers. The difference phases may be generated differently from the disclosed embodiments of the present invention.

The above embodiments of the present invention are illustrative and not limiting. Various alternatives and equivalents are possible. The invention is not limited by the type of integrated circuits in which the present disclosure may be disposed. Other additions, subtractions or modifications are obvious in view of the present invention and are intended to fall within the scope of the appended claims.

What is claimed is:

1. A circuit comprising:
a trans-admittance amplifier receiving a Radio Frequency (RF) signal and generating in response a pair of differential current signals;
a trans-impedance amplifier comprising at least four mixers and at least four amplifiers, the at least four mixers down-converting a frequency of the received pair of differential current signals to generate a first differential signal pair $TZ_0$ having a relative phase of 0 degrees, a second differential signal pair $TZ_{45}$ having a relative phase of 45 degrees, a third differential signal pair $TZ_{90}$ having a relative phase of 90 degrees, and a fourth differential signal pair $TZ_{135}$ having a relative phase of 135 degrees, each of the four pairs of differential signals having a phase corresponding to a different phase of a local oscillator signal, each of the at least four amplifiers being associated with a different one of the four pairs of differential signals; and
a summing block adapted to:
generate an in-phase signal using a first weighted sum of the four differential signals; and
generate a quadrature phase signal using a second weighted sum of the four differential signals, wherein the generated in-phase signal is defined substantially by $TZ_0+(\sqrt{2}+1)TZ_{45}+(\sqrt{2}+1)TZ_{90}+TZ_{135}$.

2. The circuit of claim 1, wherein the signal $TZ_0$ has a phase of 0 degrees relative to the phase of the local oscillator signal, wherein the signal $TZ_{45}$ has a phase of 45 degrees relative to the phase of the local oscillator signal, the signal $TZ_{90}$ has a phase of 90 degrees relative to the phase of the local oscillator signal, and wherein the signal $TZ_{135}$ has a phase of 135 degrees relative to the phase of the local oscillator signal.

3. The circuit of claim 2, wherein each of the mixers receives a 12.5% duty cycle non-overlapping clock signal.

4. The circuit of claim 1, wherein the generated quadrature signal is defined substantially by $(\sqrt{2}+1)TZ_0+TZ_{45}+TZ_{90}+(\sqrt{2}+1)TZ_{135}$.

5. The circuit of claim 1, wherein the trans-admittance amplifier comprises:
a low-noise amplifier having an input terminal and an output terminal;
a first gain stage having a first input capacitively coupled to the output terminal and a first output; and
a second gain stage having a second input capacitively coupled to the input terminal and a second output;
wherein a noise of the low-noise amplifier appearing at the first and second outputs are canceled by a common-mode rejection of the trans-impedance amplifier.

6. The circuit of claim 1 further comprising:
an analog-to-digital converter configured to convert the in-phase signal to a digital in-phase signal and the quadrature phase signal to a digital quadrature signal.

7. The circuit of claim 6 further comprising a processing unit configured to process the in-phase and quadrature digital signals.

8. A method for providing a baseband signal having reduced harmonics comprising:
receiving a Radio Frequency (RF) signal;
generating a pair of differential current signals in response to the received RF signal;
frequency down-converting the pair of differential current signals using at least four mixers to generate a first differential signal pair $TZ_0$ having a relative phase of 0 degrees, a second differential signal pair $TZ_{45}$ having a relative phase of 45 degrees, a third differential signal pair $TZ_{90}$ having a relative phase of 90 degrees, and a fourth differential signal pair $TZ_{135}$ having a relative phase of 135 degrees, each of the four pairs of differential signals having a different phase relative to a local oscillator signal;
generating an in-phase signal using a first weighted sum of the four pairs of differential signals; and
generating a quadrature signal using a second weighted sum of the four pairs of differential signals, wherein the generated in-phase signal is defined substantially by $TZ_0+(\sqrt{2}+1)TZ_{45}+(\sqrt{2}+1)TZ_{90}+TZ_{135}$.

9. The method of claim 8 further comprising:
generating at least four different phases of the local oscillator signal; and
applying each of the at least four phases of the local oscillator signal to a different one of at least four mixers.

10. The method of claim 8, wherein each of the at least four mixers receives a 12.5% duty cycle non-overlapping clock signal.

11. The method of claim 8, wherein the generated quadrature phase signal is defined substantially by $(\sqrt{2}+1)TZ_0+TZ_{45}+TZ_{90}+(\sqrt{2}+1)TZ_{135}$.

* * * * *